(12) United States Patent
Kobayashi

(10) Patent No.: US 6,610,597 B2
(45) Date of Patent: Aug. 26, 2003

(54) METHOD OF FABRICATING A SEMICONDUCTOR DEVICE

(75) Inventor: Migaku Kobayashi, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/060,569

(22) Filed: Jan. 29, 2002

(65) Prior Publication Data

US 2002/0081850 A1 Jun. 27, 2002

Related U.S. Application Data

(63) Continuation of application No. 09/640,959, filed on Aug. 16, 2000, now abandoned.

(51) Int. Cl.[7] .............................................. H01L 21/302
(52) U.S. Cl. ...................... 438/653; 438/694; 438/627; 438/629; 204/192.12; 204/192.17; 204/298.06; 204/298.11
(58) Field of Search ....................... 204/192.17, 192.12, 204/298.06, 298.11; 438/694, 653, 627, 629

(56) References Cited

U.S. PATENT DOCUMENTS

| | | | | |
|---|---|---|---|---|
| 5,656,545 A | * | 8/1997 | Yu .............................. | 438/627 |
| 5,714,804 A | * | 2/1998 | Miller et al. ................ | 253/763 |
| 5,793,113 A | * | 8/1998 | Oda .......................... | 257/774 |
| 5,972,179 A | * | 10/1999 | Chittipeddi et al. ... | 204/192.17 |

FOREIGN PATENT DOCUMENTS

| | | |
|---|---|---|
| JP | 05-326517 | 12/1993 |
| JP | 09-293790 | 11/1997 |
| JP | 09-321141 | 12/1997 |
| JP | 10-065004 | 3/1998 |
| JP | 10-312973 | 11/1998 |

OTHER PUBLICATIONS

English Abstracts of JP 10–065004; JP 05–326517, and JP 10–312973 noted above.
Copy of Japanese Patent Office Action dated Mar. 20, 2002 regarding corresponding foreign application.
English translation of indicated portions of above japanese Patent Office Action.
"Advanced PVD Ti/TiN Lines For Contact And Via Applications", Barth et al., SPIE, vol. 3214, pp. 2–12; (1997).*
English Abstracts of JP 09–321141 and 09–293790 noted above.
Copy of Korean Patent Office Action dated May 29, 2002 regarding corresponding foerign application. Japanese Translation of the above–mentioned Korean Patent Office Action.
English translation of indicated portions of the Japanese translation of the above Korean Patent Office Action.

* cited by examiner

*Primary Examiner*—George Goudreau
(74) *Attorney, Agent, or Firm*—Darryl G. Walker; Bradley T. Sako

(57) ABSTRACT

A semiconductor manufacturing process is disclosed that may form a contact structure with a tungsten plug. A contact structure hole may be adequately filled with tungsten, while avoiding plug loss, increased resistance and/or trenching, that can result from conventional approaches. According to one particular embodiment, a titanium film (003) may be deposited with an anisotropic sputtering method, such as an ion metal plasma method, or the like. A titanium film (003) may have a thickness outside a contact hole (020) that is 100 nm or more. However, due to anisotropic sputtering, a titanium film (003) within a contact hole (020) may be thinner than outside the contact hole (020). A contact hole (020) may then be filled with a tungsten film (005). A tungsten film (005) and titanium film (003) may then be etched back leaving a tungsten plug having shape with an upwardly projecting portion.

27 Claims, 12 Drawing Sheets

METHOD OF FABRICATING A SEMICONDUCTOR DEVICE

This application is a cntinuation of patent application Ser. No. 09/640,959 filed Aug. 16, 2000 now abandoned.

TECHNICAL FIELD

The present invention relates generally to the manufacture of semiconductor devices, and more particularly to manufacture of contacts and/or vias that include conductive plugs.

BACKGROUND OF THE INVENTION

Continuing advances in semiconductor manufacturing processes have resulted in semiconductor devices with finer features and/or higher degrees of integration. Among the various features that may be included within a semiconductor device are contact structures (including "vias") that typically provide an electrical connection between circuit devices and/or layers. The above-mentioned advances have led to contact structures with smaller sizes and/or higher aspect ratios. A contact aspect ratio may be the ratio between a contact depth and width.

A typical contact structure may include forming a contact hole in an insulating layer and then filling such a contact hole. Contact structures with smaller contact sizes and/or higher aspect ratios can be more difficult to fill than larger contacts and/or contacts with lower aspect ratios. Consequently, a contact filling material is often selected for its ability to adequately fill a contact hole.

Two common conductive materials that may be included in a semiconductor manufacturing process are aluminum and copper. Such materials have been included in interconnect patterns and the like. However, it has been difficult to form small and/or high aspect ratio contacts with aluminum. Similarly, while can copper provides advantageously low resistance, it is believed that many technical problems may have to be overcome before copper contact structures may be practically implemented. In view of the above drawbacks to materials such as aluminum and copper, many conventional contact forming methods include tungsten as a contact filling material.

One method of forming contact structures with tungsten includes a selective tungsten chemical vapor deposition (W-CVD) method. In a selective W-CVD method, tungsten may be deposited essentially only on silicon exposed at the bottom of a contact hole. It is believed that current conventional selective W-CVD methods are not sufficiently reproducible to provide satisfactory results in a manufacturing process. Further, adverse results may result when selective W-CVD methods are used to fill contacts having depths that vary. More particularly, a contact hole that is shallow with respect to the other contact holes may suffer from excessive growth (overgrowth) of tungsten in the contact hole. Overgrowth of tungsten may then be corrected with an etch back step that removes only overgrown portions. However, such an etch back step can add to the complexity and/or cost of a manufacturing process.

In light of the drawbacks present in selective W-CVD approaches, conventional "blanket" W-CVD methods are widely used for filling contact holes. In a blanket W-CVD method, contact holes may be formed in an insulating layer. Tungsten may then be deposited over the surface of the insulating layer, filling the contact holes. Deposited tungsten may then be etched back to remove tungsten from the top surface of the insulating layer while tungsten within the contact holes remains. Tungsten remaining within a contact hole is often referred to as a tungsten "plug."

A conventional method for forming a tungsten plug in a contact with a blanket W-CVD method will now be described with reference to FIGS. 3A–3D and 4A–4B.

In a conventional contact formation process, an interlayer insulating film 002 may be formed on a silicon substrate 001 that includes an impurity diffusion region 011. An interlayer insulating film 002 may include silicon dioxide ($SiO_2$), for example. A contact hole 020 may then be formed through the interlayer insulating film 002 to the impurity diffusion region 011. A structure following the formation of such a contact hole 020 is shown in FIG. 3A.

Referring now to FIG. 3B, a titanium film 003 may be deposited on the surface of the interlayer insulating film 002, including within the contact hole 020. A titanium film 003 may be deposited with a conventional sputtering method, and to a thickness in the range of about 20 nm to 50 nm. A conventional sputtering method may be isotropic. A titanium film 003 may serve as a barrier layer for subsequent contact materials, preventing such materials from diffusing into a semiconductor substrate 001.

Referring now to FIG. 3C, following the deposition of a titanium film 003, a titanium nitride film 004 may be deposited on the exposed surface, including within the contact hole 020. A titanium nitride film 004 may be deposited with a reactive sputtering method, and to a thickness in the range of about 20 nm to 50 nm. In such a reactive sputtering method, a titanium target may be a source of titanium. Titanium particles from a target may react with nitrogen before reaching a device surface thereby providing titanium nitride as a sputtered material.

A layered film of titanium/titanium nitride (003/004) may serve as an adhesion layer for a subsequently deposited material, such as tungsten. Following the deposition of a layered titanium/titanium nitride film (003/004), a temperature cycling step may be used to further improve the adhering characteristics of such a layered film. As but one example, a ramp anneal may be performed at 650° C. for 30 seconds. Such a ramp anneal may result in a reaction between the film materials, as well as a reaction between a titanium film 003 and an interlayer insulating film 002 that furthers the adhering characteristics of the layered film.

Referring now to FIG. 3D, a layer of tungsten 005 may then be deposited over a layered of film of titanium/titanium nitride (003/004). A tungsten deposition step may include a source gas that, includes tungsten, such as tungsten hexafluoride ($WF_6$), as but one example. Such a deposition step may form a layer of tungsten 005 over a layered of film of titanium/titanium nitride (003/004), thereby filling a contact hole 020.

An etch back step may then be performed that removes portions of tungsten on the interlayer insulating film 002 while leaving tungsten within a contact hole 020, thereby forming a tungsten plug. Such a tungsten etch back step may include a fluorine containing gas. For example, tungsten may be plasma etched with sulfur hexafluoride ($SF_6$) as a source gas.

Following the etch back of tungsten, exposed portions of the layered titanium/titanium nitride (003/004) film may be removed with a chlorine containing gas. A contact structure following such a step is shown in FIG. 4A. The result may be a contact structure with a tungsten plug.

Following the formation of a tungsten plug, an interconnect film may be formed over a semiconductor substrate 001, including over a tungsten plug. An interconnect film may include aluminum, as but one example. Such an interconnect film may then be patterned to form an interconnect structure 006. A semiconductor device following the formation of an interconnect structure 006 is shown in FIG. 4B.

In this way, a conventional W-CVD process may be used to form a tungsten plug that connects and interconnect structure 006 to a semiconductor substrate 001.

A drawback to a conventional approach, such as that shown in FIGS. 3A–3D and 4A–4B, can be a resulting shape of a tungsten plug. More particularly, as shown in FIG. 4A, an upper portion tungsten 005 formed within a contact hole 020 may have a recess. Such a recess may be formed when a tungsten film 005 and/or layered titanium/titanium nitride film (003/004) is etched back. More particularly, such layers may essentially be overetched to help ensure that residual tungsten, titanium and/or titanium nitride is not left on a surface of interlayer insulating film 002. Such an overetching can remove an upper portion of tungsten 005 that is within a contact hole 020.

A recess in an upper portion of a tungsten plug (i.e., increased "plug loss"), can result in worse step coverage for an overlying interconnect structure 006. FIG. 4B shows such an arrangement. An interconnect structure 006 must extend into a portion of a contact hole 020, over a step formed when a tungsten 005 top surface is lower than an interlayer insulating film 002 top surface. Such a structure may lead to undesirably increased resistance in an interconnect structure 006. Further, in such a structure, material in an interconnect layer 006 may be more susceptible to electromigration.

Plug loss may also present difficulties for subsequent structures. For example, an interconnect structure 006 formed over a tungsten plug having a recess may have an uneven surface. A second interlayer insulating film may be formed over an interconnect structure 006. A via hole may then be etched through the second insulating film to the interconnect structure 006. The uneven surface of an interconnect structure 006 may make it difficult to remove all of a second insulating film. If all of the second insulating film is not removed, a via may have higher contact resistance.

FIG. 10 shows a conventional sputtering apparatus. Such an apparatus may be used to deposit a film of titanium as shown in FIG. 3B. A conventional sputtering apparatus may include a substrate holder 031. A substrate holder 031 can hold a semiconductor substrate 032, that is to be processed, in an essentially parallel orientation to a target 035. A target 035 may be formed from a material that is to be deposited (e.g., titanium).

A magnet 033 may be disposed on one surface of the target 035, while an opposite surface can face a semiconductor substrate 032. A target 035 may also be connected to a DC power source 034.

The application of a voltage to a target 035 can result in sputtering particles 037 being released from the target 035. In the conventional approach illustrated, sputtering particles 037 can be incident on a semiconductor substrate 032 from various directions due to scattering. Consequently, a sputtering apparatus shown in FIG. 10 can provide isotropic sputtering particles.

One approach to addressing plug loss is disclosed in Japanese Laid-Open Patent Publication No. 9-321141. In particular, the publication shows a technique in which the thickness of a titanium nitride layer is thicker than the previously described approach. A titanium nitride layer may have a thickness in the range of 100–200 nm, instead of 20–50 nm. This technique will be explained with reference to FIGS. 5A–5D and 6A–6D.

In the technique of FIGS. 5A–5D and 6A–6D, an interlayer insulating film 002 may be formed on a silicon substrate 001 that includes an impurity diffusion region 011. An interlayer insulating film 002 may include silicon dioxide ($SiO_2$), for example. A contact hole 020 may then be formed through the interlayer insulating film 002 to the impurity diffusion region 011. A structure following the formation of such a contact hole 020 is shown in FIG. 5A.

Referring now to FIG. 5B, a titanium film 003 may be deposited on the surface of the internal insulating film 002, including within the contact hole 020. A titanium film 003 may be deposited with a conventional sputtering method, and to a thickness of about 30 nm. A conventional sputtering method may be isotropic.

Referring now to FIG. 5C, following the deposition of a titanium film 003, a titanium nitride film 004 may be deposited on the exposed surface, including within the contact hole 020. A titanium nitride film 004 may be deposited with a reactive sputtering method, and to a thickness in the range of about 150 nm to 200 nm. A conventional reactive sputtering method may also be isotropic.

Referring now to FIG. 5D, a layer of tungsten 005 may then be deposited over a layered film of titanium/titanium nitride (003/004), thereby filling a contact hole 020.

Referring now to FIG. 6A, an etch back step may then be performed that removes portions of tungsten on the interlayer insulating film 002 until a titanium nitride layer 004 is exposed. Such a tungsten etch back step may include a reactive plasma etch with sulfur hexafluoride ($SF_6$) and argon (Ar) as source gases.

Following the etch back of tungsten, exposed portions of the layered titanium/titanium nitride film (003/004) may be etched. Such an etching may be a two-stage process. In a first step, the layered titanium/titanium nitride film (003/004) may be etched with a reactive ion etch (RIE) having a high selectivity with respect to titanium nitride. Such a RIE step may remove titanium nitride 004 and can expose a titanium layer 003. A structure following such a first step is shown in FIG. 6B.

In a second step, the layered titanium/titanium nitride film (003/004) may be etched with a reactive ion etch (RIE) having a lower reactivity than that of the first step, described above. As but one example, such a second etching step may include a source gas flow rate ratio between chlorine gas ($Cl_2$) and argon gas (Ar) of about 1:30 and a high frequency power of about 450 W. Such a second step may remove portions of the layered titanium/titanium nitride film (003/004) on the surface of a interlayer insulating film 002, thereby forming a tungsten plug, as shown in FIG. 6C.

As in the previously described conventional example, following the formation of a tungsten plug, an interconnect film may be formed over a semiconductor substrate 001, including over a tungsten plug. An interconnect film may include aluminum, as but one example. Such an interconnect film may then be patterned to form an interconnect structure 006. A semiconductor device following the formation of an interconnect structure 006 is shown in FIG. 6D.

In this way, a tungsten plug may be formed that has an upwardly projecting top portion, and not a recess, as is the case of methods that suffer from plug loss.

While the technique of FIGS. 5A–5D and 6A–6D can provide an approach for addressing plug loss, such an approach is not without disadvantages. Such disadvantages will now be described with reference to FIGS. 9A and 9B.

A first disadvantage can be insufficient filling of a contact hole. When a titanium nitride film 004 thickness is increased, the remaining space in a contact hole 020 that is to be filled with tungsten 005 can be significantly reduced. As noted above, a titanium nitride deposition method may be essentially isotropic. Consequently, the thicker titanium nitride film 005 can be formed on the side walls of a contact hole 020. A resulting reduced contact space is shown in FIG. 9A. Such a reduced contact space can be harder to fill by conventional tungsten deposition processes.

Further, an isotropic deposition of titanium nitride can result in an overhanging shape at the upper portion of a contact hole. One example of such an overhanging shape is shown in FIG. 9B. An overhanging shape can reduce the size of the top of a contact hole opening, making it more difficult to subsequently fill the contact hole.

As manufacturing technology continues to advance, contact holes (including via holes) continue to decrease in size. As but one example, contact holes of 0.3 $\mu$m or less may be formed. Thus, filling such smaller contact holes in light of the above disadvantage can become an increasingly more difficult task.

A second disadvantage can be an increase in plug resistance. In a technique such as that shown in FIGS. 5A–5D and 6A–6D, a thicker titanium nitride film can be formed on the inner walls of a contact hole. Thus, a contact may include more titanium nitride in cross section than is the case of other conventional methods. Because titanium nitride can have a higher resistance than tungsten, a contact structure according to FIGS. 5A–5D and 6A–6D can have a higher resistance than other conventional approaches.

A third disadvantage can be trenching (or "gouging") on a top portion of a contact structure. Such trenching may occur when titanium nitride is removed by etching. More particularly, when an adhering layer, such as titanium/titanium nitride (003/004) is etched, portions of the adhering layer at the top of a contact structure can be removed, leaving recesses. The formation of such recesses is often referred to as trenching. When adhering layers are relatively thin, such trenching can be relatively small. However, because such a layer is thicker in the method according to FIGS. 5A–5D and 6A–6D, trenching may be large with respect to other conventional approaches. If relatively large trenching occurs, contacts with higher interconnect resistance and/or reduced electromigration resistance may result.

In the method according to FIGS. 5A–5D and 6A–6D, a two step etch method for removing an adhering film may reduce trenching in some cases. However, such a two step approach can add complexity to a manufacturing process. Further, while effective in some cases, such an approach may be less effective in other cases. In a particular, for contact holes having a diameter of 0.3 $\mu$m or less, effects of trenching are increased and may not be sufficiently addressed.

In light of the above discussion, it would be desirable to arrive at some way of forming contact structures that can prevent plug loss without incurring the drawbacks of insufficient contact hole filling, increased resistance, or trenching on the top of the contact structure.

SUMMARY OF THE INVENTION

According to the present invention, a semiconductor manufacturing process may include forming an insulating film on a semiconductor substrate. A contact hole may then be formed in the first insulating film. A titanium film may then be deposited over the first insulating film and in the contact hole. The titanium film may be deposited with an anisotropic sputtering method to a thickness outside the contact hole of 100 nm or more. A titanium nitride film may then be formed over the titanium film. A tungsten film can then be deposited over the titanium nitride film, including within the contact hole. A first etch step may then remove tungsten to expose the titanium nitride film outside the contact hole. One or more subsequent etch steps may then remove titanium and titanium nitride films outside the contact hole, thereby forming a tungsten plug. An interconnect conductive film may then be formed over the tungsten plug.

According to one aspect of the present invention, by forming the titanium layer with an anisotropic sputtering method, the thickness of the titanium film outside a contact hole may be 100 nm or more, while the thickness of such a film within a contact hole may be substantially smaller. This can enable tungsten to be deposited in the contact hole with fewer defects. Further, when the titanium and titanium nitride films are removed, a tungsten plug may be formed with an upwardly projecting top portion.

DETAILED DESCRIPTION OF THE EMBODIMENTS

Various embodiments of the present invention will now be described to in detail with reference to a number of drawings.

A method for forming a contact structure according to a first embodiment will now be described in conjunction with a series of side cross sectional views shown in FIGS. 1A to 1D and 2A to 2C.

Figure 1A:
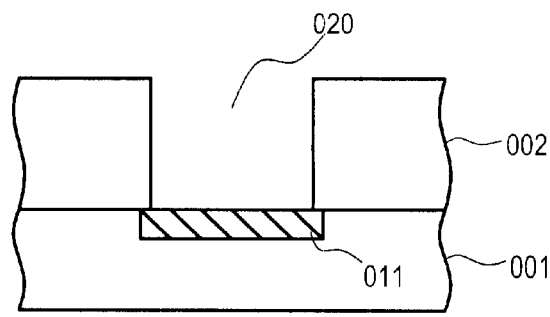
FIGS. 1A to 1D are side cross sectional views of a first embodiment.

Referring now to FIG. 1A, a first embodiment may include forming an interlayer insulating film 002 over a substrate 001. An interlayer insulating film 002 may comprise silicon dioxide ($SiO_2$), as but one example. A semiconductor substrate 001 may comprise silicon and include an impurity region 011 formed therein.

As shown in FIG. 1A, a contact hole 020 may be formed through an interlayer insulating film 002 to an impurity region 011 in a semiconductor substrate 001. A contact hole 020 may have an aspect ratio greater than 5, more particularly about 6 or more. A contact hole 020 may also have an inner diameter less than 0.3 μm, more particularly about 0.2 μm, and a depth greater than 1.0 μm, more particularly about 1.2 μm.

Figure 1B:
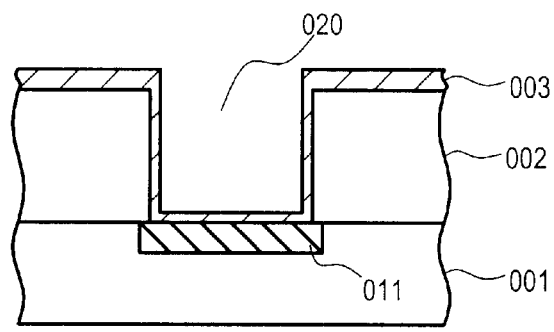
Figure 1C:
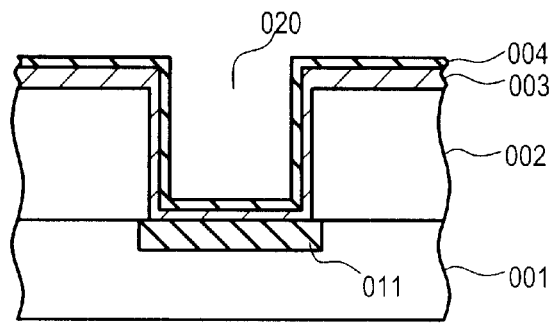

As shown in FIG. 1B, a titanium film 003 may then be formed on the surface of the interlayer insulating film 002, including within the contact hole 020. A titanium film 003 may have a thickness outside a contact hole 020 of about 100 nm or more, preferably 150 nm or more. A titanium film 003 thickness may be selected taking into account a contact hole diameter. For example, for the above titanium film 003 thickness, a contact hole may have a diameter of 300 nm or less, more preferably 250 nm or less.

A titanium film 003 thickness should preferably be large enough to prevent a recess in a subsequently formed plug, as will be discussed in more detail below. This can overcome the drawbacks of plug loss present in conventional approaches. If a titanium film 003 thickness outside a contact hole 020 is too thin, recesses may result, incurring the drawbacks discussed above.

It is also noted that a titanium film 003 should have a particular thickness within a contact hole 020. If a titanium film 003 is too thin, it may not serve as an adequate barrier between a semiconductor substrate 001 and other contact materials. Further, if a titanium film 003 within a contact hole 020 is too thin, its adhering properties may be inadequate. On the other hand, if a titanium film 003 it too thick, a contact hole 020 opening may become so narrow, that subsequently filling the contact hole 020 may become problematic.

According to one embodiment, a titanium film 003 may be deposited with an anisotropic sputtering method. Such a method may generate sputtering particles that have a substantially vertical incidence with a semiconductor substrate. Thus, in an anisotropic sputtering method, sputtering particles have large vertical incidence components. In such an environment, the number of sputtering particles that adhere to vertical walls of a contact hole is reduced with respect to isotropic sputtering approaches. As a result, the thickness of a titanium film 003 outside a contact hole 020 may be substantially thicker than the titanium film 003 inside the contact hole 020.

It will be recalled that previously described conventional approaches with isotropic sputtering may form a titanium film having essentially the same thickness both inside and outside a contact hole. A thicker titanium film inside a contact hole may lead to increased contact resistance and/or difficulties in filling a contact hole. An anisotropic sputtering approach according to the present invention can overcome such drawbacks.

It will also be recalled that isotropic deposition of a contact material may form overhanging structures at the top of a contact hole. Overhanging structures can limit the size of a contact hole opening making it more difficult to fill the contact hole. An anisotropic sputtering approach according to the present invention can overcome this drawback as well.

While there may be various approaches to anisotropic sputtering according to the present invention, possible specific examples may include a collimate sputtering method, a "long throw" sputtering method, or an ion metal plasma method, to name but a few.

Of the various named methods, an ion metal plasma method may be preferable for contact and via holes having an aspect ratio greater than 5. An ion metal plasma method may form a film where the film thickness outside a contact hole is significantly greater than the film thickness on side walls inside the contact hole. Such differences in thickness can be particularly suitable for forming contact structures according to the present invention. In addition, an ion metal plasma method may provide better sputtering efficiency over other anisotropic sputtering methods.

An example of an ion metal plasma anisotropic sputtering method will now be described in more detail.

An ion metal plasma method can be a physical vapor deposition method that includes a coil that is driven with RF energy. Such a coil may be situated within a sputtering chamber and may ionize sputtering particles released from a target.

Figure 11:
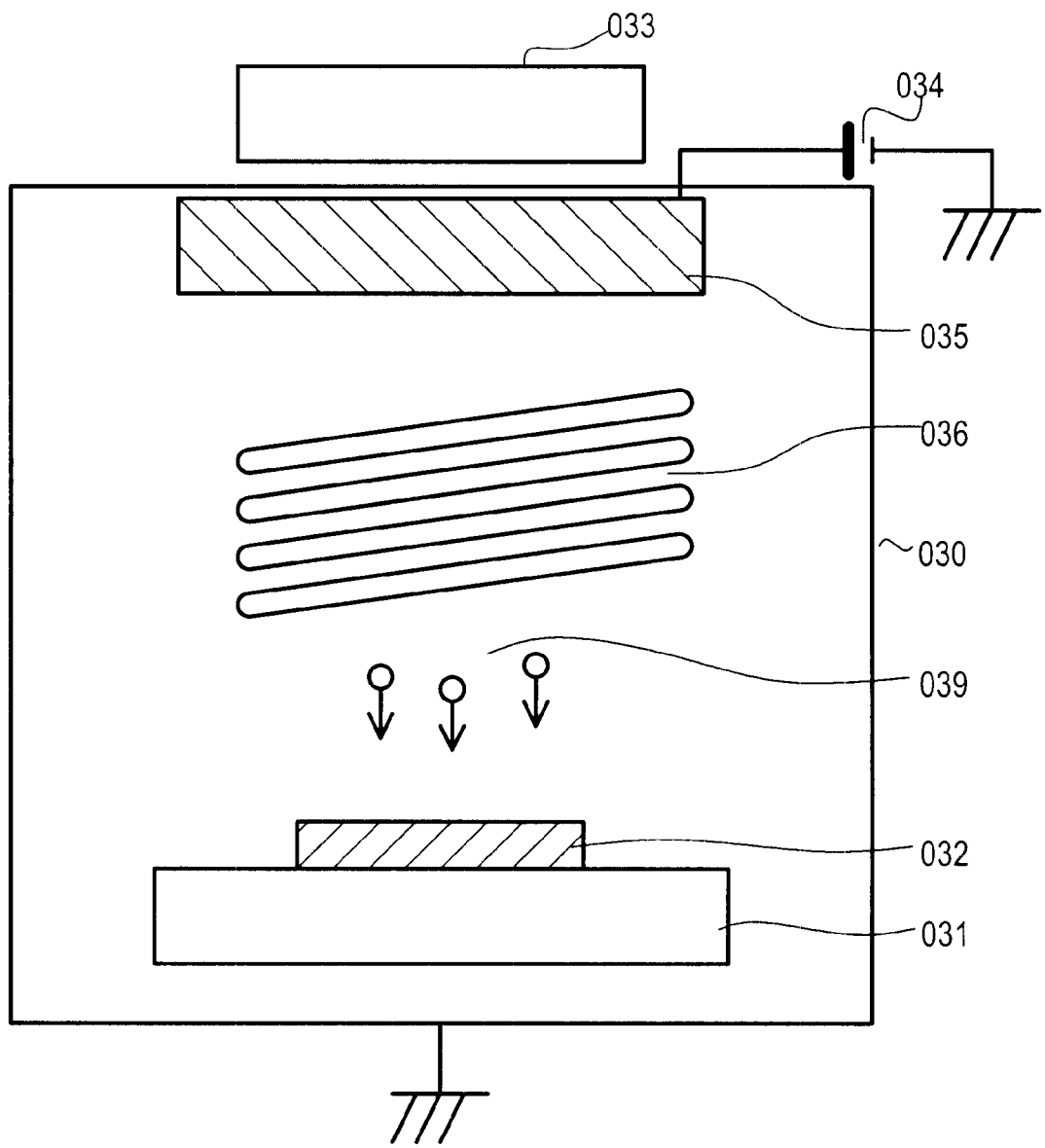
FIG. 11 is a diagram of an ion metal plasma sputtering apparatus.

An ion metal plasma sputtering apparatus is shown in FIG. 11. An ion metal plasma sputtering apparatus may include a substrate holder 031. A substrate holder 031 can hold a semiconductor substrate 032, that is to be processed, in an essentially parallel orientation to a target 035. A target 035 may be formed from a material that is to be deposited (e.g., titanium).

A target 035 may be connected to a DC power source 034 while a substrate holder 031 may be connected to ground. A magnet 033 may be disposed on one surface of the target 035, while an opposite surface can face a semiconductor substrate 032. The apparatus of FIG. 11 further includes a coil 036 disposed between the target 035 and the semiconductor substrate 032. A coil 036 may be connected to a RF power source (not shown).

The application of a voltage to a target 035 can result in sputtering particles being generated. A coil 036 may generate a high-density inductively coupled RF plasma, which can ionize sputtering particles 039. Such ionized sputtering particles 039 may then be influenced by the electrical field between the target 035 and the semiconductor substrate 032 to have a vertical incidence with a semiconductor substrate 032. In this way, in an ion metal plasma method, sputtering particles 039 are ionized and then influenced by an electrical field to provide an essentially anisotropic sputtering of a material (e.g., titanium).

As but one specific example, an ion metal plasma method may have the following conditions. A sputtering chamber 030 pressure may be about 20 mTorr. A substrate temperature may be about 150° C. A DC power may be about 2.3 kW. A RF power for a coil 036 may be about 2.8 kW.

Referring back to FIG. 1C, following the essentially anisotropic sputtering of titanium, a titanium nitride film 004 may be formed. A titanium nitride film 004, like a titanium film 003, may serve as a barrier between the semiconductor substrate 001 and a subsequently formed plug material (e.g., tungsten). Further, a titanium nitride film 004 can improve the adherence of the subsequently formed plug material.

In one particular approach, a titanium nitride film 004 may be deposited with a reactive sputtering method. In such a reactive sputtering method, a titanium target may be a source of titanium, and titanium particles from a target may react with nitrogen before reaching a device surface.

In this way a layered film of titanium/titanium nitride (003/004) may be formed that serves as an adhesion layer and/or a barrier layer for a subsequently deposited material, such as tungsten.

Following the deposition of a layered titanium/titanium nitride film (003/004), a temperature cycling step may be used to further improve the adhering characteristics of such a layered film. As but one example, a ramp anneal may be performed at 650° C. for 30 seconds. Such a ramp anneal may result in a reaction between the film materials, as well as a reaction between a titanium film 003 and an interlayer insulating film 002 that furthers the adhering characteristics of the layered film.

Figure 1D:
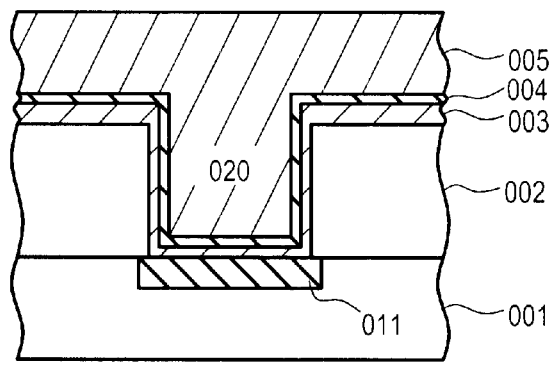

Referring now to FIG. 1D, a tungsten film 005 may be deposited over a layered film of titanium/titanium nitride (003/004). A tungsten deposition step may include a mixed gas that includes a tungsten source gas, such as tungsten hexafluoride ($WF_6$). In one particular arrangement, a tungsten film 005 may be deposited with chemical vapor deposition techniques at a temperature of about 400° C. and a pressure of about 6 Torr. Such a tungsten (W) chemical vapor deposition (CVD) step may form a layer of tungsten 005 over a layered film of titanium/titanium nitride (003/004), thereby filling a contact hole 020.

Following the deposition of a tungsten film 005, a tungsten film 005 can be etched back to form a plug. Preferably, a tungsten etch back step may have a degree of selectivity between tungsten and titanium nitride.

As but one specific example, a tungsten etch back step may be performed under the following conditions. Etch source gases may include sulfur hexafluoride ($SF_6$) flowing at about 110 standard cubic centimeters per minute (sccm) and argon (Ar) flowing at about 90 sccm. An etch chamber may be at a pressure of about 280 mTorr. Such an etch may be a reactive plasma etch with an RF power of about 600 W.

Figure 2A:
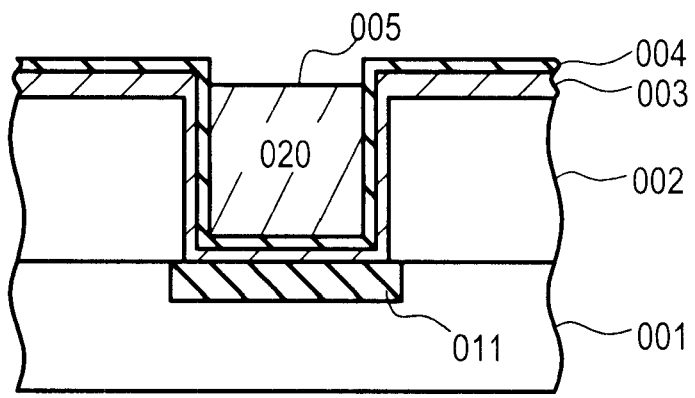
FIGS. 2A to 2C are side cross sectional views of the first embodiment.

A tungsten etch back step may be performed until the titanium nitride film 004 outside the contact hole 020 is exposed. A contact structure following a tungsten etch back step is shown in FIG. 2A. In order to prevent residual tungsten from remaining outside the contact hole 020, a tungsten etch back may include overetching. Consequently, as shown in FIG. 2A, the tungsten 005 remaining in the contact hole 020 may be recessed with respect to the top surface of the titanium nitride film 004 and/or titanium film 003.

Figure 2B:
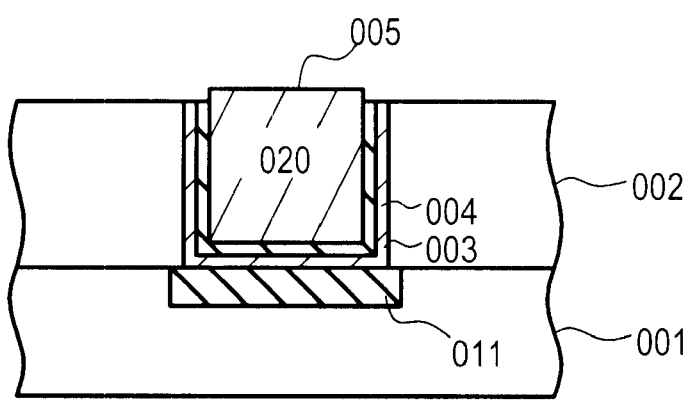

Following the etch back of a tungsten film 005, the titanium film 003 and titanium nitride film 004 may be etched. Such an etch may be selective between tungsten 005 and the titanium film 003/titanium nitride film 004. Portions of the titanium/titanium nitride films (003/004) outside the contact hole 020 can be removed, leaving a contact structure with a tungsten plug 005 that has a projecting shape as shown in FIG. 2B.

To form tungsten 005 with a projecting shape, the deposited thickness of the titanium/titanium nitride films (003/004) can be equal to or greater than a recess generated when tungsten 005 is etched back.

One specific example of a titanium/titanium nitride film (003/004) etch may be performed under the following conditions. Etch gases may include chlorine gas ($Cl_2$) flowing at about 10 sccm and Ar flowing at about 30 sccm. An etch chamber may be at a pressure of about 200 mTorr. Such an etch may be a reactive plasma etch with an RF power of about 300 W.

Figure 2C:
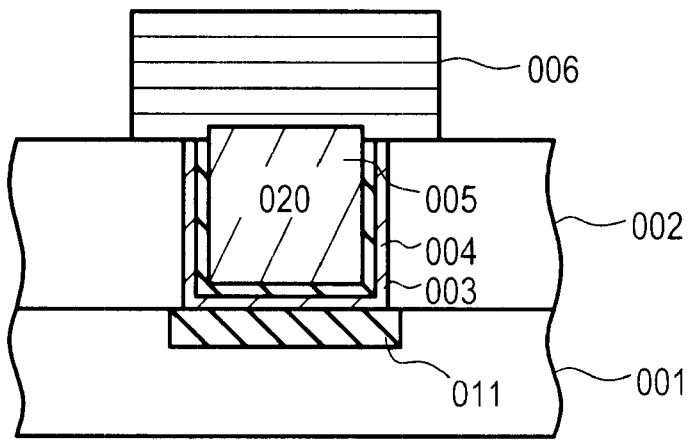
Figure 3A:
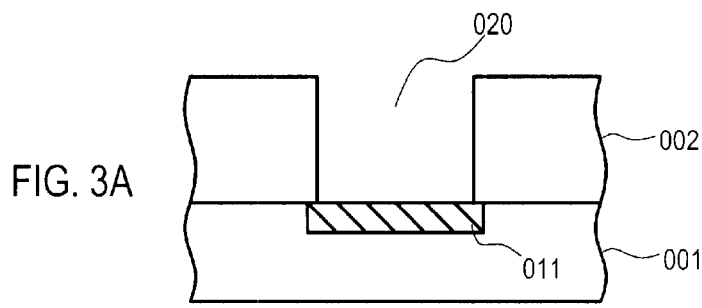
FIGS. 3A to 3D are side cross sectional views of a first conventional contact forming method.
Figure 3B:
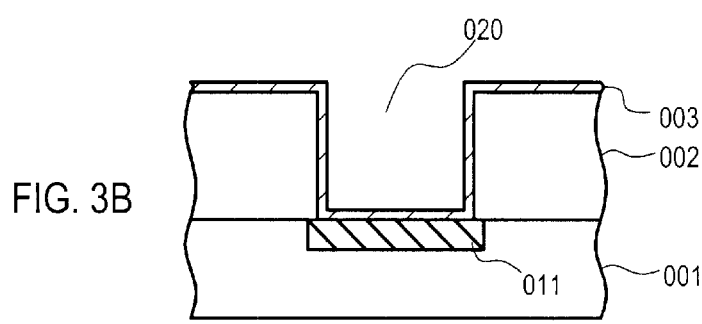
Figure 3C:
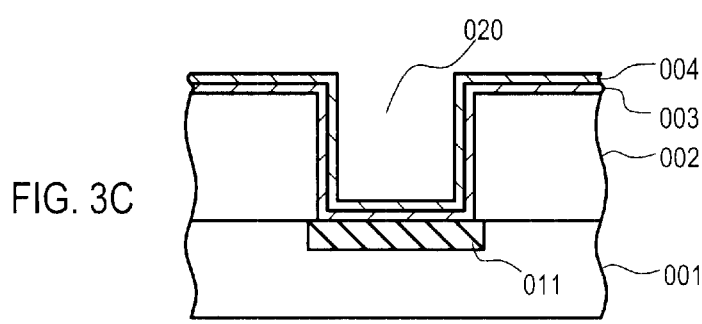
Figure 3D:
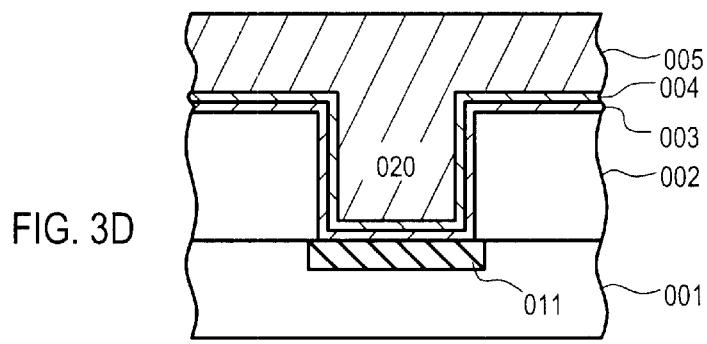
Figure 4A:
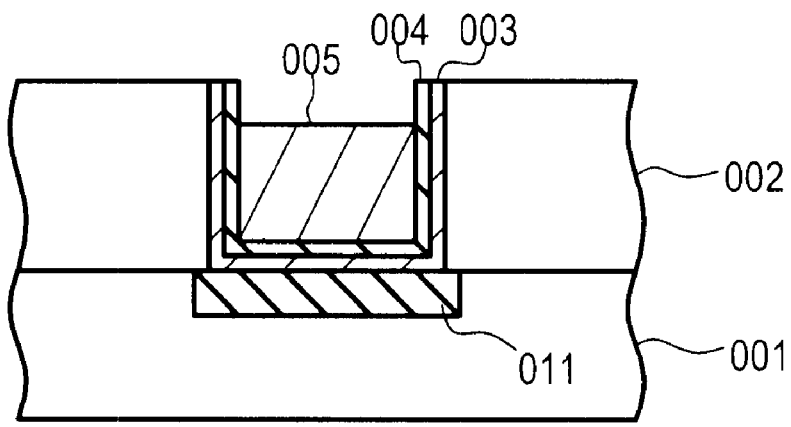
FIGS. 4A and 4B are side cross sectional views of the first conventional contact forming method.
Figure 4B:
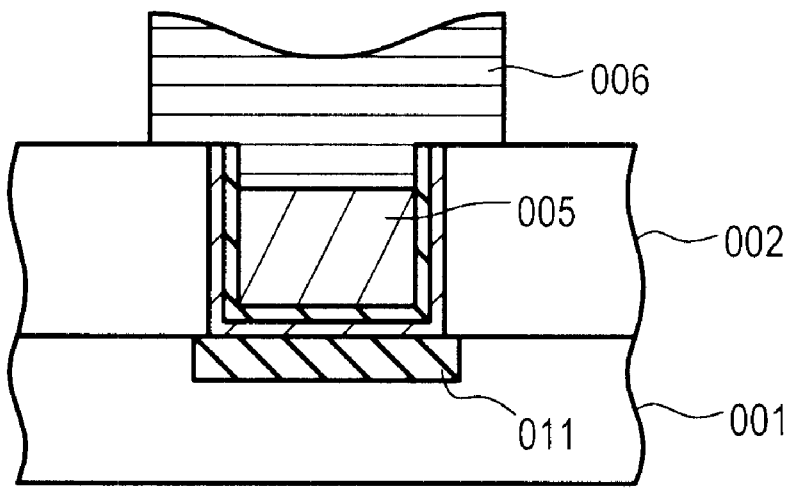
Figure 5A:
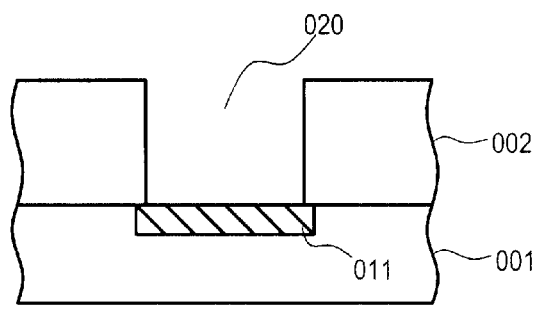
FIGS. 5A to 5D are side cross sectional views of a second conventional contact forming method.
Figure 5B:
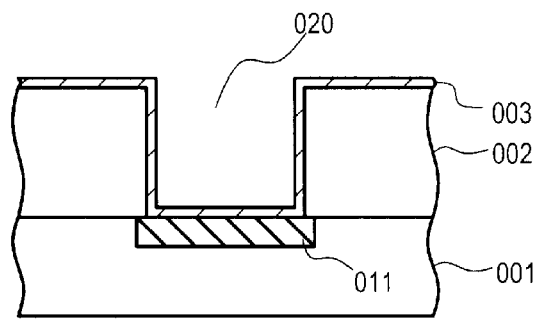
Figure 5C:
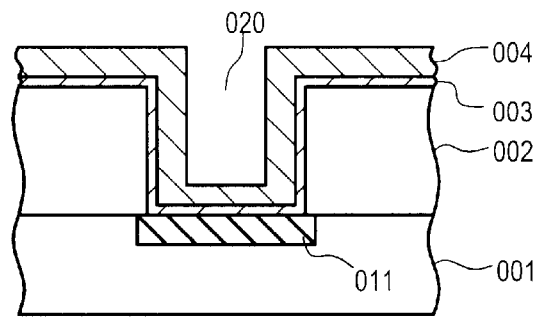
Figure 5D:
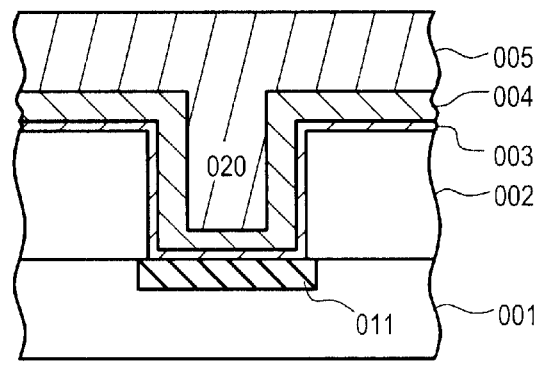
Figure 6A:
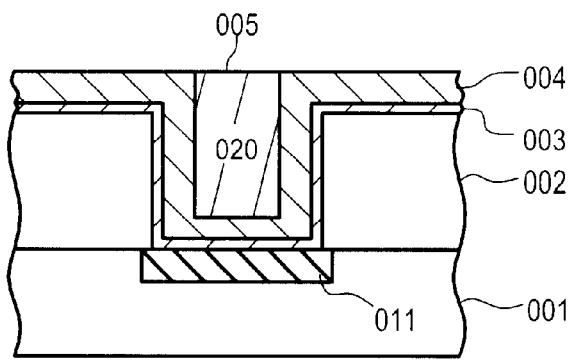
FIGS. 6A to 6D are side cross sectional views of the second conventional contact forming method.
Figure 6B:
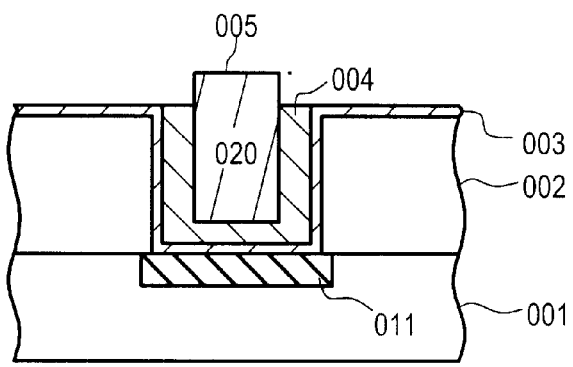
Figure 6C:
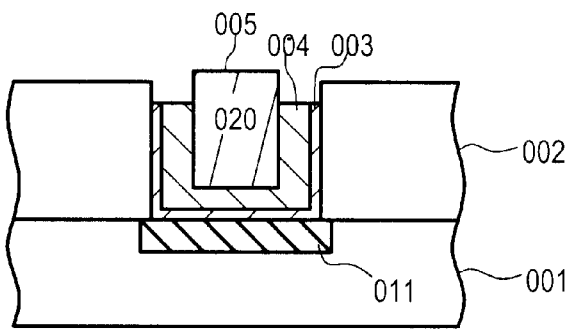
Figure 6D:
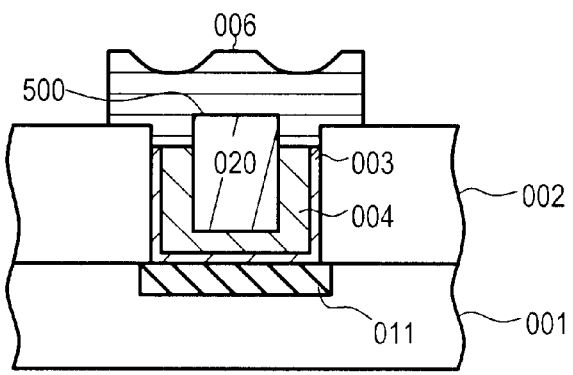

Following the formation of a tungsten plug with a projecting shape, an interconnect film may be formed over a semiconductor substrate 001, including over the tungsten plug 005. An interconnect film may include aluminum, as but one example. Such an interconnect film may then be patterned to form an interconnect structure 006. A semiconductor device following the formation of an interconnect structure 006 is shown in FIG. 2C.

In this way, according to a first embodiment, a contact structure can be formed with a tungsten plug 005 that has a projecting shape, as opposed to a recess. Such an advantageous shape may be formed by depositing a titanium film 003 that is thicker with respect to other conventional approaches. In this way, plug loss may be prevented.

In addition, because a titanium film 003 of a first embodiment may be deposited with an anisotropic sputtering method, a titanium film 003 thickness within a contact hole 020 may be less than a thickness outside the contact hole 020. In this way, a thicker titanium film 003 can be provided without narrowing a contact hole 020 opening, as is the case of other conventional approaches. Because a contact hole 020 opening is not reduced, a contact hole 020 may be more easily filled and may not suffer from higher resistance, as in other conventional cases as described above.

Having described one particular embodiment for forming a contact structure that extends between a interconnect structure 006 and a semiconductor substrate 001, a second embodiment will now be described that may form a contact structure between two interconnect layers (i.e., a via).

Figure 7A:
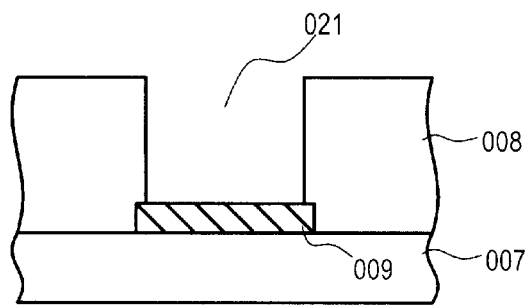
FIGS. 7A to 7D are side cross sectional views of a second embodiment.

Referring now to FIG. 7A, a second embodiment may include forming a lower interconnect 009 on a first interlayer insulating film 007. A second interlayer insulating film 008 may then be formed over the lower interconnect 009. As but one example, a second interlayer insulating film 008 may comprise silicon dioxide ($SiO_2$), while a lower interconnect 009 may comprise aluminum.

As shown in FIG. 7A, a via hole 021 may be formed through a second interlayer insulating film 008 to a lower interconnect 009. A via hole 021 may have an aspect ratio greater than 4, more particularly about 5 or more. A via hole 021 may also have an inner diameter less than 0.3 $\mu$m, more particularly about 0.2 $\mu$m, and a depth greater than 0.8 $\mu$m, more particularly about 1.0 $\mu$m.

Figure 7B:
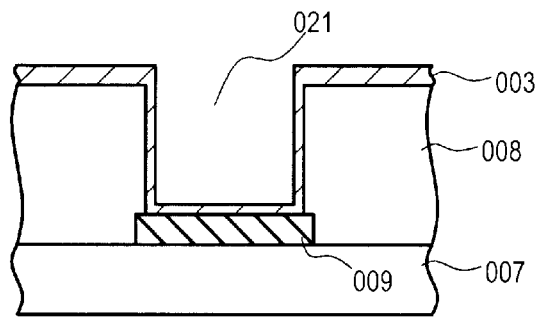

As shown in FIG. 7B, a titanium film 003 may then be formed on the surface of the second interlayer insulating film 008, including within the via hole 021. A titanium film 003 may have a thickness outside a via hole 021 of about 100 nm or more, preferably 150 nm or more. In a similar fashion to the first embodiment, a titanium film 003 thickness may be selected by taking into account a via hole diameter. For example, a via hole may have a diameter of 300 nm or less, more preferably 250 nm or less.

Like the first embodiment, a titanium film 003 thickness should preferably be large enough to prevent a recess in a subsequently formed plug. A titanium film 003 should also have sufficient thickness within a via hole 021. If a titanium film 003 is too thin, it may not serve as an adequate barrier between a semiconductor substrate 001 and other via materials and/or its adhering properties may be inadequate. Conversely, a titanium film 003 should not be too thick, as a via hole 021 opening may become too narrow, making it more difficult to subsequently fill the via hole 021.

According to the second embodiment, a titanium film 003 may be deposited with an anisotropic sputtering method. Such a method may generate sputtering particles that have a substantially vertical incidence with a semiconductor substrate.

Various anisotropic sputtering methods were previously listed. For the particular second embodiment described herein, a collimate sputtering method will be described in more detail.

Figure 12:
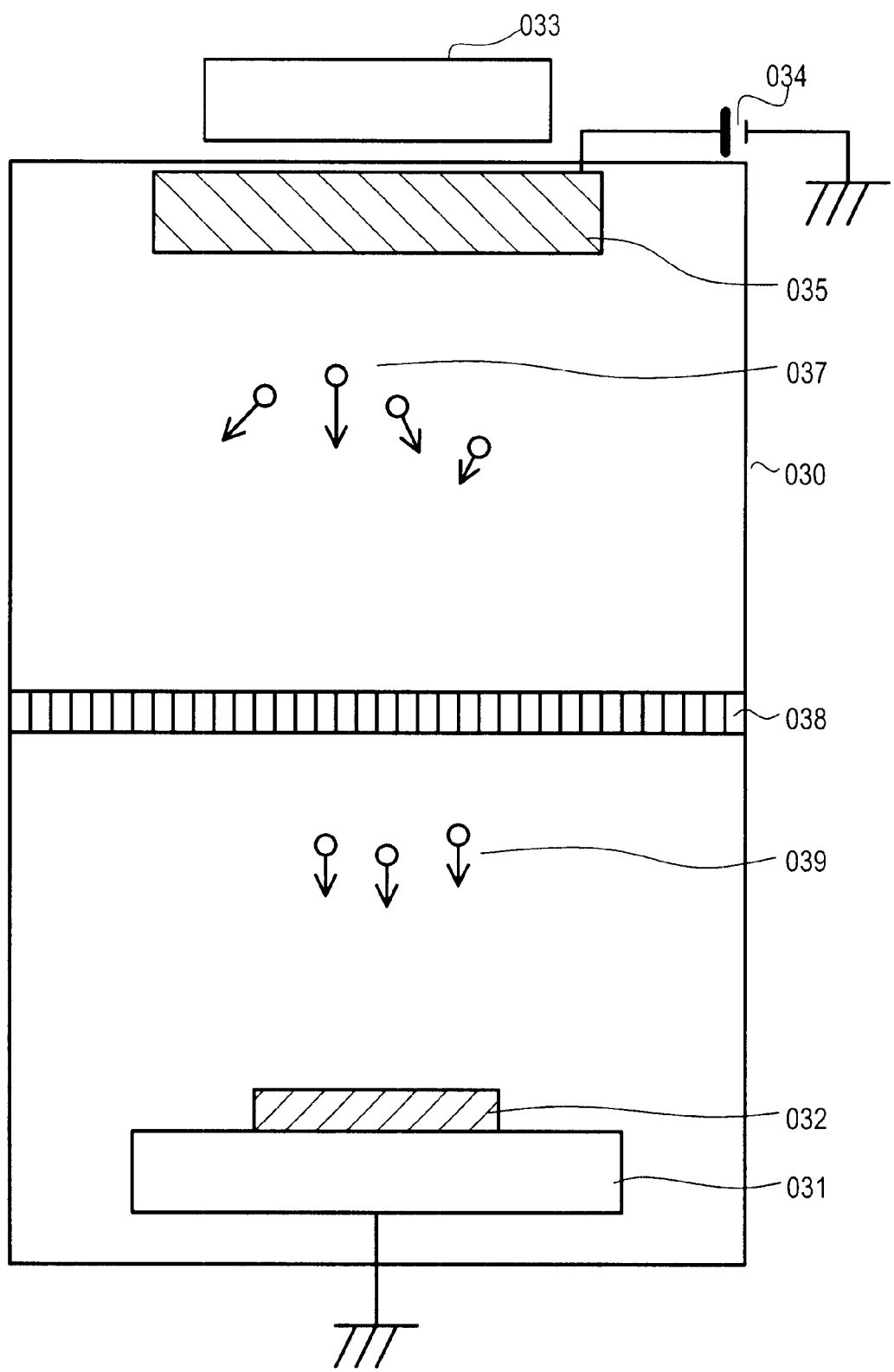
FIG. 12 is a diagram of a collimate sputtering apparatus.

A collimate sputtering apparatus is shown in FIG. 12. A collimate sputtering apparatus may include a substrate holder 031 that can hold a semiconductor substrate 032 in an essentially parallel orientation to a target 035. A target 035 may be formed from a material that is to be deposited (e.g., titanium).

A target 035 may be connected to a DC power source 034 while a substrate holder 031 may be connected to ground. A magnet 033 may be disposed on one surface of the target 035, while an opposite surface can face a semiconductor substrate 032. The apparatus of FIG. 12 further includes a shielding plate, referred to herein as a collimator 038. A collimator 038 may be disposed between the target 035 and the semiconductor substrate 032.

A collimator 038 may discriminate between sputtering particles 037. More particularly, of the various sputtering particles 037 released from the target 035, a collimator may only allow particular sputtering particles 039 to pass through to a semiconductor substrate 001. Particular sputtering particles 039 may be those sputtering particles having an essentially vertical incidence with a semiconductor substrate 001. In this way, in a collimate sputtering method, particular sputtering particles 039 may be selectively passed through to a semiconductor substrate 001, thereby providing an essentially anisotropic sputtering of a material (e.g., titanium).

As but one specific example, a collimate sputtering method may have the following conditions. A sputtering chamber may have an aspect ratio of about 2. A sputtering chamber pressure may be about 2 mTorr. A substrate temperature may be about 200° C. A DC power may be about 1.5 kW.

Figure 7C:
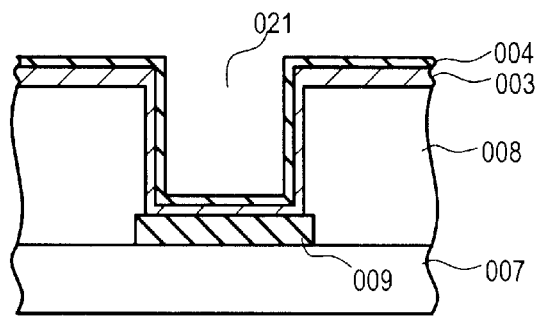

Referring back to FIG. 7C, following the essentially anisotropic sputtering of titanium, a titanium nitride film 004 may be formed. A temperature cycling step may then be performed to further improve the adhering characteristics of a titanium/titanium nitride film (003/004). A temperature cycling step may be a ramp anneal, as but one example.

Figure 7D:
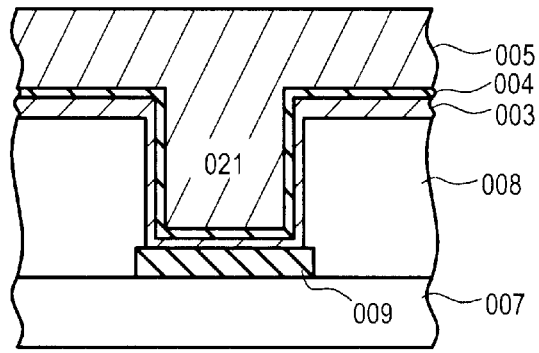

Referring now to FIG. 7D, a tungsten film 005 may then be deposited. A tungsten deposition step may include a mixed gas that includes a tungsten source gas, such as tungsten hexafluoride ($WF_6$).

Following the deposition of a tungsten film 005, a tungsten film 005 can be etched back to form a plug. Preferably, a tungsten etch back step may have a degree of selectivity between tungsten and titanium nitride. A tungsten etch back step may be a reactive ion etch with an etch gas that includes fluorine.

Figure 8A:
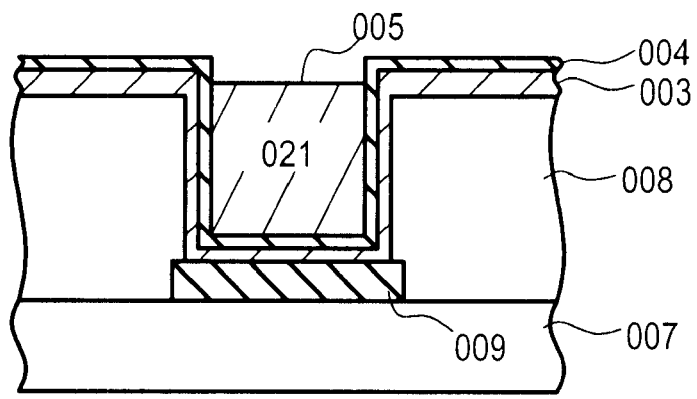
FIGS. 8A to 8C are side cross sectional views of the second embodiment.

A tungsten etch back step may be performed until the titanium nitride film 004 outside the via hole 021 is exposed. A contact structure following a tungsten etch back step is shown in FIG. 8A.

Figure 8B:
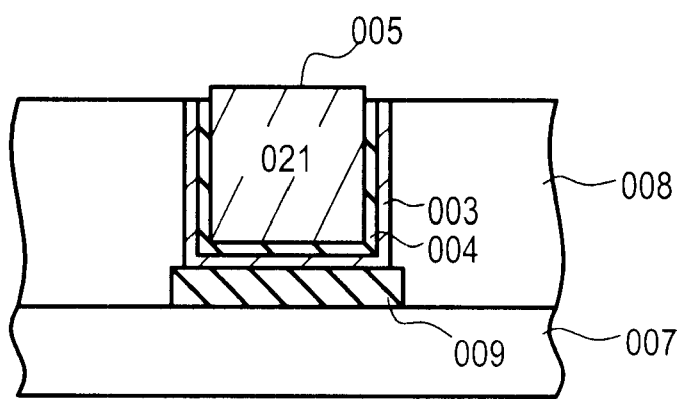

Following the etch back of a tungsten film 005, the titanium film 003 and titanium nitride film 004 may be etched. Such an etch may be selective between tungsten 005 and the titanium film 003/titanium nitride film 004. Portions of the titanium/titanium nitride films (003/004) outside the via hole 021 can be removed, leaving a contact structure with tungsten plug 005 that has a projecting shape as shown in FIG. 8B.

To form a tungsten plug 005 with a projecting shape, the deposited thickness of the titanium/titanium nitride films (003/004) can be equal to or greater than a recess generated when tungsten 005 is etched back. A titanium/titanium nitride film (003/004) etch may be a reactive plasma etch with a source gas that includes chlorine.

Figure 8C:
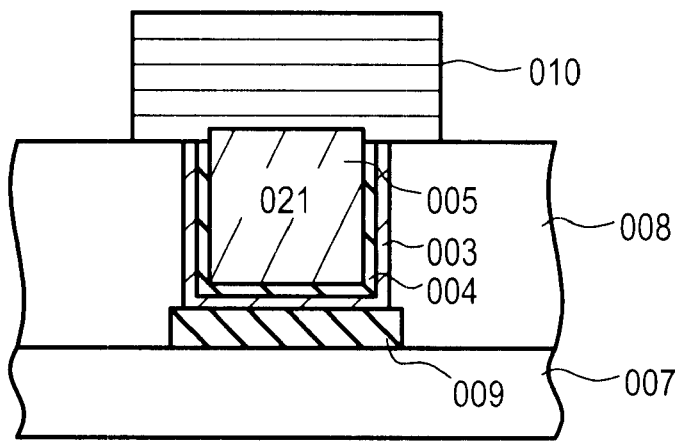
Figure 9A:
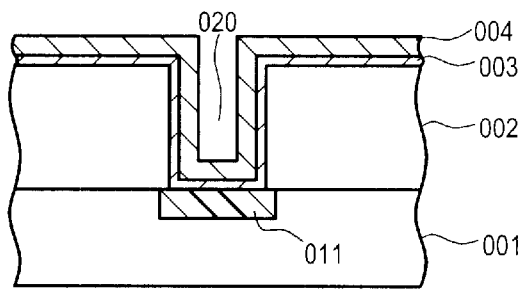
FIGS. 9A and 9B are side cross sectional views illustrating drawbacks to the second conventional contact forming method.
Figure 9B:
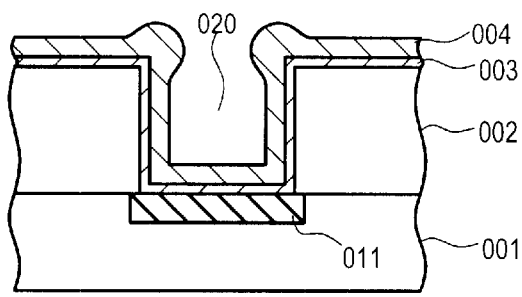

Following the formation of a tungsten plug with a projecting shape, a second interconnect film may be formed over a semiconductor substrate 001, including over the tungsten plug 005. A second interconnect film may include aluminum, as but one example. Such a second interconnect film may then be patterned to form a second interconnect structure 010. A semiconductor device following the formation of a second interconnect structure 010 is shown in FIG. 8C.

In this way, according to a second embodiment, a via structure can be formed with a tungsten plug 005 that has a projecting shape, as opposed to a recess. Such an advantageous shape may be formed by depositing a titanium film 003 that is thicker with respect to other films than conventional approaches. In this way, plug loss in a via may be prevented.

In addition, because a titanium film 003 of a second embodiment may be deposited with an essentially anisotropic sputtering method, a titanium film 003 thickness within a via hole 021 may be less than a thickness outside the via hole 021. In this way, a thicker titanium film 003 can be provided without narrowing a via hole 021 opening, as is the case of other conventional approaches. Because a via hole 021 opening is not reduced, a via hole 021 may be more easily filled and may not suffer from higher resistance, as in other conventional cases as described above.

While the first and second embodiments have described particular approaches to anisotropically sputtering a particular layer (e.g. titanium), as noted above, other methods may be used. For example, a third embodiment may follow the various steps of the first or second embodiments, but may include a different method for anisotropically sputtering a titanium film. Such a different method may include a long throw sputtering method.

Figure 13:
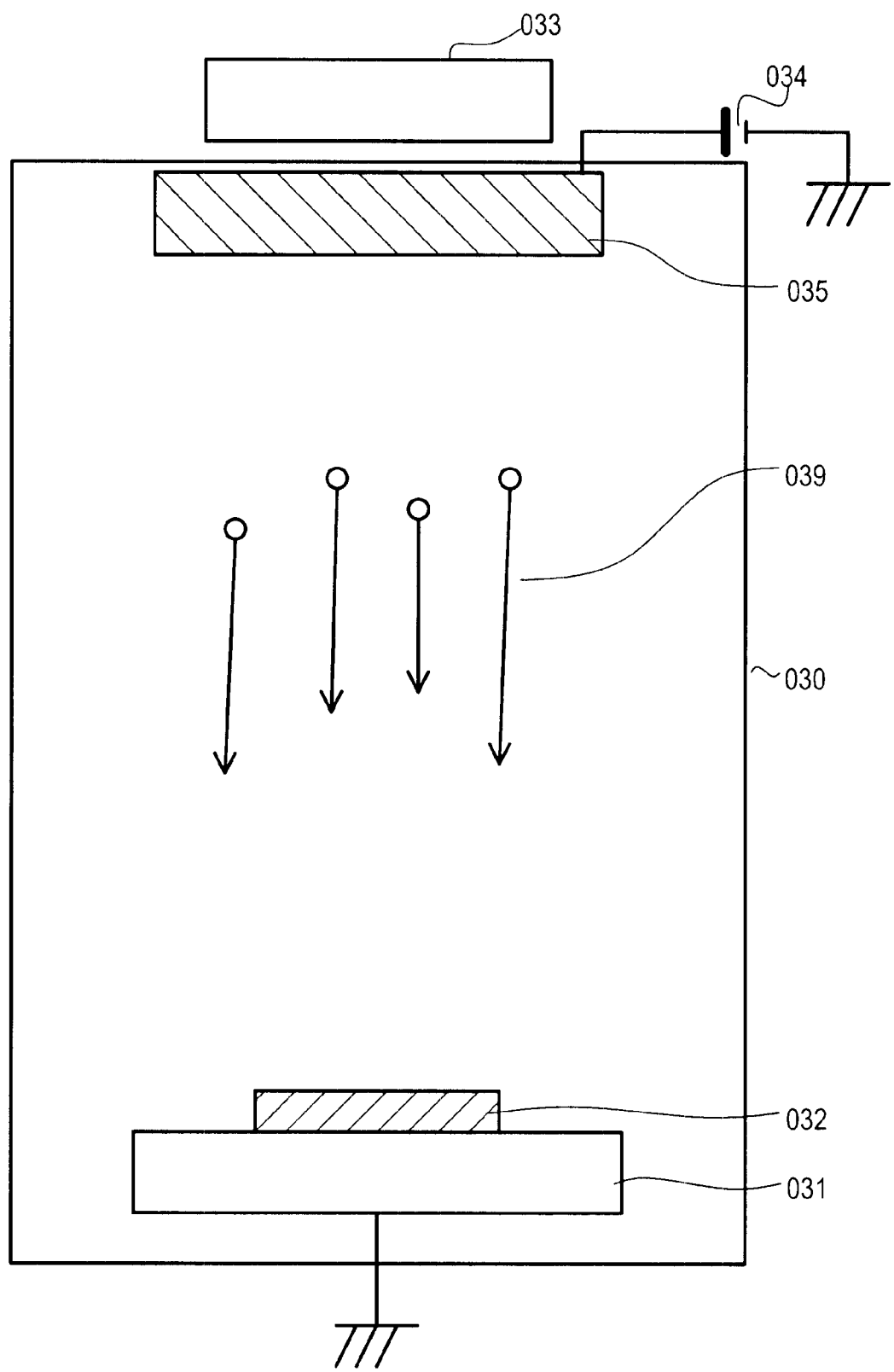
FIG. 13 is a diagram of a long throw sputtering apparatus.

A long throw sputtering apparatus is shown in FIG. 13. A long throw sputtering apparatus may include a substrate holder 031 that can hold a semiconductor substrate 032 in an essentially parallel orientation to a target 035. A target 035 may be formed from a material that is to be deposited (e.g., titanium).

A target 035 may be connected to a DC power source 034 while a substrate holder 031 may be connected to ground. A magnet 033 may be disposed on one surface of the target 035, while an opposite surface can face a semiconductor substrate 032. The application of a voltage to a target 035 can generate sputtering particles.

Figure 10:
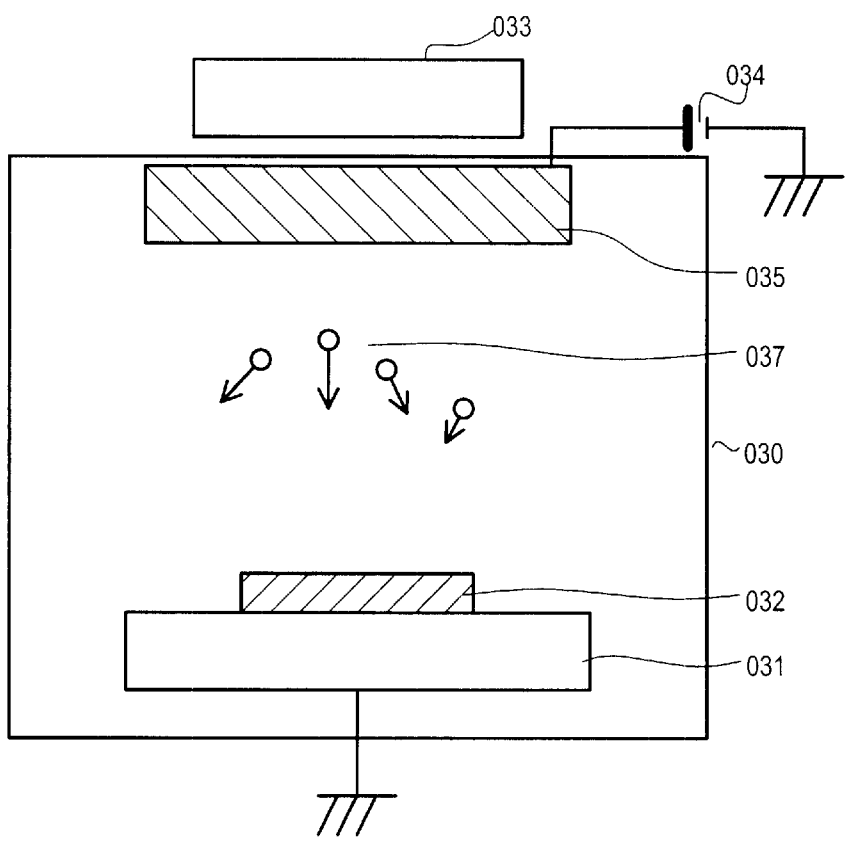
FIG. 10 is a diagram of a conventional sputtering apparatus.

A long throw sputtering apparatus may differ from a conventional sputtering apparatus in a chamber pressure and/or in distance between a target 035 and semiconductor substrate 032. For example, in a conventional sputtering apparatus, such as that shown in FIG. 10, sputtering may be conducted at a pressure in the general range of 2.0 to 10.0 mTorr. In contrast, according to one embodiment, a long throw sputtering method may be performed at a lower pressure, such as 1.0 mTorr or less. In addition, or alternatively, the distance between a target 035 and a semiconductor substrate 001 may be about three to six times longer than in a conventional sputtering apparatus.

A lower sputtering chamber pressure can result in a longer mean free path for sputtering particles. Consequently, sputtering particles 039 released from a target 035 may have straighter paths, and not be scattered multiple times, as in a conventional sputtering process.

A longer distance between a target 035 and a semiconductor substrate 032 may lead to more sputtering particle anisotropy. More particularly, those particles that are released at an angle that is tilted with respect to a semiconductor substrate 032 (i.e. have substantially non-vertical path components) may attach to side walls of a sputtering chamber. Thus, substantially most of the sputtering particles that may reach a semiconductor substrate 001 have an essentially vertical incidence, thereby providing an essentially anisotropic sputtering of a material (e.g., titanium).

While the various embodiments have been described with respect to contact holes and/or via holes having diameters of 0.3 μm or less, such particular contact sizes and shapes should not be construed as necessarily limiting the invention thereto.

However, the present invention may provide advantages at such smaller contact hole size. In particular, a method according to the present invention may be advantageous with contact/via holes that are smaller than 0.3 μm, more particularly contact/via holes with a diameter of 0.25 μm or less. For such smaller contact/via holes, tungsten may often be used as a plug material, and so may be subject to possible defects as previously described. While approaches may seek to improve deposition characteristics, such improvements may limit the degree of freedom in a process, such as the selection of a particular barrier metal film, or the like. Thus, for smaller contact/via hole sizes it can be difficult to realize reductions in plug loss while at the same time providing satisfactory film deposition characteristics. The present invention can provide for satisfactory deposition characteristics while at the same time reducing plug loss.

The various embodiments have described structures and methods for forming a contact structure (including a via) that includes a first film (e.g., titanium) that is anisotropically deposited prior to a hole filling film (e.g., tungsten) that may form a plug. An anisotropic deposition may include an ion metal plasma method, or the like. In one arrangement, a first film thickness outside a contact hole may be 100 nm or greater. Consequently, following an etch back of the hole filling film and first film, a plug may have a shape that includes an upwardly projecting portion. In this way, a contact/via hole may be filled without necessarily incurring plug loss and/or increased resistance.

While the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of forming a contact plug, comprising the steps of:
    selectively making a hole in an insulating layer that has a top surface, a side-wall surface being thereby formed in said insulating layer to define said hole;
    forming a barrier layer on said insulating layer such that a first portion of said barrier layer on said top surface of said insulating layer is greater in thickness than a second portion of said barrier on said side-wall surface of said insulating layer, said second portion of said barrier layer defining a space corresponding to said hole;
    depositing a conductive layer over said first and second portions of said barrier layer while filling said space;
    etching back said conductive layer until said first portion of said barrier layer is exposed to thereby form a plug portion that fills said space and has a top surface which projects above said top surface of said insulating layer; and
    removing said first portion of said barrier layer until said top surface of said insulating layer is exposed to thereby form a contact plug that fills said space and has a top surface which projects above said top surface of said insulating layer.

2. The method as claimed in claim 1, wherein said barrier layer comprises a first metal film and said first metal film is formed by anisotropic sputtering.

3. The method as claimed in claim 2, wherein said first metal film comprises titanium.

4. The method as claimed in claim 2, wherein said anisotropic sputtering is performed in an ion metal plasma sputtering manner.

5. The method as claimed in claim 2, wherein said anisotropic sputtering is performed in a collimate sputtering manner.

6. The method as claimed in claim 2, wherein said anisotropic sputtering is performed in a long throw sputtering manner.

7. The method as claimed in claim 2, wherein said barrier layer further comprises a second metal film that is formed on said first metal film by an isotropic sputtering.

8. The method as claimed in claim 7, wherein said first metal film comprises titanium and said second metal layer comprises titanium nitride.

9. The method as claimed in claim 7, wherein said anisotropic sputtering is performed in an ion metal plasma sputtering manner.

10. The method as claimed in claim 7, wherein said anisotropic sputtering is performed in a collimate sputtering manner.

11. The method as claimed in claim 7, wherein said anisotropic sputtering is performed in a long throw sputtering manner.

12. A method of forming a contact hole, comprising the steps of:
    etching through a first insulating film to form a contact hole therein;
    depositing a first conductive film on the first insulating layer and a side inner surface of the contact hole;
    depositing a second conductive film on the first conductive film;
    depositing a third conductive film that fills the contact hole; and
    etching to expose the first insulating film around the contact hole and form a plug from the third conductive film that extends above a top surface of the first insulating film.

13. The method of claim 12, wherein
    the first conductive film comprises titanium; and
    the second conductive film comprises titanium nitride.

14. The method of claim 12, wherein
    the third conductive film comprises tungsten.

15. The method of claims 12, wherein
    the step of etching includes
        etching the third conductive film to a level below the first conductive film and above the first insulating film, and
        etching the first and second conductive films to expose the top surface of the first insulating film.

16. A method, comprising the steps of:
    depositing first conductive film over a first insulating layer having a hole formed therein, the first conductive film being thicker over a top surface of the first insulating layer than on a side surface of the hole;
    depositing a second conductive film over the first conductive film;
    depositing a third conductive film over the second conductive film and within the hole; and
    etching the third conductive film selective to the second conductive film to expose the second conductive film around the hole, the third conductive film being only within the hole and having a plug top that extends above the top surface of the first insulating layer but below a top surface of the second conductive film.

17. The method of 16, wherein the hole is less than 0.3 microns wide.

18. The method of claim 17, wherein the hole is less than 0.25 microns wide.

19. The method of claim 16, wherein the step depositing the first conductive film is with an anisotropic method selected from the group consisting of ion metal plasma sputtering, collimate sputtering, and long throw sputtering.

20. A method of forming a contact plug, comprising the steps of:

electively making a hole in an insulating layer that has a top surface, a side-wall surface being thereby formed in said insulating layer to define said hole;

forming a barrier layer on said top surface of said insulating layer such that a first portion of said barrier layer on said top surface of said insulating layer is greater in thickness than a second portion of said barrier layer on said side-wall surface of said insulting layer, said second portion of said barrier layer defining a space corresponding to said hole;

depositing a conductive layer over said first and second portions of said barrier layer while filling said space;

etching back said conductive layer until said first portion of said barrier layer is exposed to thereby form a plug portion that fills said space and has a top surface which projects above said top surface of said insulating layer; and removing said first portion of said barrier layer until said top surface of said insulating layer is exposed to thereby form a contact plug tat fills said space and has a top surface which projects above said top surface of said insulating layer, wherein said baiter layer comprises a titanium film which has a first part that is contained in said first portion of said barrier layer and a second part that is contained in said second portion of said barrier layer, the thickness of said first part of said titanium film is 100 nm or more.

21. The method as claimed in claim 20, wherein said barrier layer is formed by anisotropic sputtering.

22. The method as claimed in claim 21, wherein said anisotropic sputtering is performed in an ion metal plasma sputtering manner.

23. The method as claimed in claim 21, wherein said anisotropic sputtering is performed in a collimate sputtering manner.

24. The method as claimed in claim 21, wherein said anisotropic sputtering is performed in a long throw sputtering manner.

25. The method as claimed in claim 20, wherein said barrier layer further comprises a titanium nitride film which is formed on said titanium film.

26. The method as claimed in claim 20, wherein said top surface of said plug portion is lower than said top surface of said titanium film and is higher than said top surface of said insulating layer when said etching back said conductive layer is ended.

27. The method as claimed in claim 20, wherein said thickness of said titanium film is 150 nm or more.

* * * * *

UNITED STATES PATENT AND TRADEMARK OFFICE
CERTIFICATE OF CORRECTION

PATENT NO. : 6,610,597 C1
APPLICATION NO. : 90/008914
DATED : July 21, 2009
INVENTOR(S) : Migaku Kobayashi It is certified that error appears in the above-identified patent and that said Letters Patent is hereby corrected as shown below:

COLUMN 2, LINE 19:

In Claim 1, ~~titantium~~ should read titanium.

Signed and Sealed this

Ninth Day of February, 2010

David J. Kappos
*Director of the United States Patent and Trademark Office*

(12) EX PARTE REEXAMINATION CERTIFICATE (6951st)
United States Patent
Kobayashi

(10) Number: US 6,610,597 C1
(45) Certificate Issued: Jul. 21, 2009

(54) METHOD OF FABRICATING A SEMICONDUCTOR DEVICE

(75) Inventor: Migaku Kobayashi, Tokyo (JP)

(73) Assignee: NEC Electronics Corporation, Nakahara-Ku, Kawasaki, Kanagawa (JP)

Reexamination Request:
No. 90/008,914, Nov. 5, 2007

Reexamination Certificate for:
Patent No.: 6,610,597
Issued: Aug. 26, 2003
Appl. No.: 10/060,569
Filed: Jan. 29, 2002

Related U.S. Application Data

(63) Continuation of application No. 09/640,959, filed on Aug. 16, 2000, now abandoned.

(51) Int. Cl.
H01L 21/02 (2006.01)
H01L 21/302 (2006.01)
H01L 21/461 (2006.01)

(52) U.S. Cl. .................. 438/653; 438/627; 438/629; 438/694; 257/E23.145; 257/E21.585; 257/E21.169; 204/192.12; 204/192.17; 204/298.06; 204/298.11

(58) Field of Classification Search .................. None
See application file for complete search history.

(56) References Cited

U.S. PATENT DOCUMENTS

| | | |
|---|---|---|
| 5,330,628 A | 7/1994 | Demaray et al. |
| 5,580,821 A | 12/1996 | Mathews et al. |
| 5,731,225 A | 3/1998 | Yamamori |

FOREIGN PATENT DOCUMENTS

| | | |
|---|---|---|
| JP | 05-326517 | 12/1993 |
| JP | 09-321141 | 12/1997 |
| JP | 10-065004 | 3/1998 |
| JP | 10-312973 | 11/1998 |
| TW | 308715 | 6/1997 |

OTHER PUBLICATIONS

Dixit, G. A., et al. "Ion Metal Plasma (IMP) Deposited Titanium Liners for 0.25/0.18 □ m Multilevel Interconnectons" IEDM, Dec. 8–11, 1996, pp. 357–360.*

Joshi, R. V. and Brodsky, S. "Collimated sputtering of TiN/Ti liners into sub–half–micrometer high aspect ratio contacts/lines" Applied Physics Letters, Nov. 23, 1992, vol. 61, No. 21, pp. 2613–2615.*

Broughton, J. N. et al. "Titanium sputter deposition at low pressures and long throw distances" Semiconductor Manufacturing, IEEE Transactions on, vol. 9, Issue 1, Feb. 1996, pp. 122–127.*

* cited by examiner

*Primary Examiner*—Erik Kielin

(57) ABSTRACT

A semiconductor manufacturing process is disclosed that may form a contact structure with a tungsten plug. A contact structure hole may be adequately filled with tungsten, while avoiding plug loss, increased resistance and/or trenching, that can result from conventional approaches. According to one particular embodiment, a titanium film (003) may be deposited with an anisotropic sputtering method, such as an ion metal plasma method, or the like. A titanium film (003) may have a thickness outside a contact hole (020) that is 100 nm or more. However, due to anisotropic sputtering, a titanium film (003) within a contact hole (020) may be thinner than outside the contact hole (020). A contact hole (020) may then be filled with a tungsten film 005). A tungsten film (005) and titanium film (003) may then be etched back leaving a tungsten plug having shape with an upwardly projecting portion.

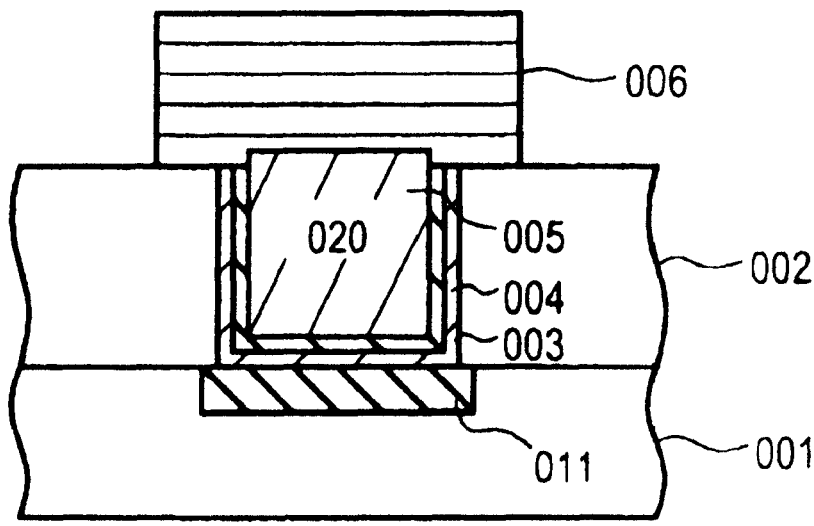

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2–6 are cancelled.

Claims 1 and 7 are determined to be patentable as amended.

Claims 8–27 were not reexamined.

1. A method of forming a contact plug, comprising the steps of:
   selectively making a hole in an insulating layer that has a top surface, a side-wall surface being thereby formed in said insulating layer to define said hole;
   forming a barrier layer *by anisotropic sputtering* on said insulating layer such that a first portion of said barrier layer on said top surface of said insulating layer is greater in thickness than a second portion of said barrier on said side-wall surface of said insulating layer, said second portion of said barrier layer defining a space corresponding to said hole;
   depositing a conductive layer over said first and second portions of said barrier layer while filling said space;
   etching back said conductive layer until said first portion of said barrier layer is exposed to thereby form a plug portion that fills said space and has a top surface which projects above said top surface of said insulating layer; and
   removing said first portion of said barrier layer until *all of* said top surface of said insulating layer is exposed to thereby form a contact plug that fills said space and has a top surface which projects above *both* said top surface of said insulating layer *and a top surface of said second portion of said barrier layer,*
   *wherein said barrier layer comprises a first metal film and said first metal film comprises titantium,*
   *and wherein said anisotropic sputtering is performed in one of manner selected from group consisting of an ion metal plasma sputtering manner, a collimate sputtering manner and a long throw sputtering manner.*

7. The method as claimed in claim [2]*1*, wherein said barrier layer further comprises a second metal film that is formed on said first metal film by an isotropic sputtering.

* * * * *